United States Patent [19]

d'Hervilly et al.

[11] 3,874,936

[45] Apr. 1, 1975

[54] METHOD OF GETTERING IMPURITIES IN SEMICONDUCTOR DEVICES INTRODUCING STRESS CENTERS AND DEVICES RESULTING THEREOF

[75] Inventors: Guy d'Hervilly, Fishkill; William A. Edel, Poughkeepsie, both of N.Y.; Jean Jacquemin, Chatenay-Malabry, France; W. Alfred Westdorp, Hopewell Junction, N.Y.

[73] Assignee: International Business Machines Corporation, Armonk, N.Y.

[22] Filed: June 25, 1973

[21] Appl. No.: 373,202

[30] Foreign Application Priority Data

June 27, 1972 France .............................. 72.24036

[52] U.S. Cl. .................... 148/1.5, 148/175, 148/187

[51] Int. Cl. ............................................... H01l 7/54

[58] Field of Search ....................... 148/1.5, 175, 187

[56] References Cited

UNITED STATES PATENTS

| | | | |
|---|---|---|---|
| 3,418,181 | 12/1968 | Robinson | 148/187 |
| 3,579,815 | 5/1971 | Gentry | 148/175 X |

OTHER PUBLICATIONS

Barson et al., "Gettering Technique," IBM Tech. Discl. Bull., Vol. 15, No. 6, Nov. 1972, p. 1752.

*Primary Examiner*—L. Dewayne Rutledge
*Assistant Examiner*—J. M. Davis
*Attorney, Agent, or Firm*—Wolmar J. Stoffel

[57] ABSTRACT

A method for gettering impurities in a semiconductor device to prevent the formation of pipes. Stress centers are formed in the non-active device regions of the device by introducing atoms into the device body having either an undersized or oversized atomic radius compared to the host semiconductor device material.

6 Claims, 5 Drawing Figures

METHOD OF GETTERING IMPURITIES IN SEMICONDUCTOR DEVICES INTRODUCING STRESS CENTERS AND DEVICES RESULTING THEREOF

BACKGROUND OF THE INVENTION

Field of the Invention

This invention relates to a method of gettering impurities in semiconductor bodies by introducing stress centers (e.g. dislocations) in the non-active device volume but in the vicinity of the active device volume: i.e. the effective base region. More particularly, the present invention describes a method to introduce stress centers by using surface, high concentration, shallow diffusions, close to the surface at desired locations of the device.

During the last years, semiconductor integrated circuit techniques and more particularly silicon material and device technology have known a considerable rate of development. Now, the aim is to achieve unprecedented levels of integration, i.e. to attain a density of about several thousand circuits per square millimeter on a semiconductor wafer (Large Scale Integration). Acute problems have been detected in some steps of the manufacturing process (typically photolithography), but also unexpected difficulties have been encountered due to the material itself, since its behavior and properties were not completely mastered.

Therefore, the semiconductor material, typically silicon, has needed better understanding from a solid state standpoint. More particularly, the presence of microdefects such as precipitates, migration of impurities, in addition to crystallographic defects like dislocations, stacking faults, have a dominating influence on yield, performance and reliability of semiconductor devices. These microdefects are well known from a theoretical point of view, and the related literature is quite abundant.

These defects generally cause in the bulk silicon material pipes resulting in shorts between emitter and collector, unexpected breakdowns, soft junctions, non-uniform doping, and many changes of the carrier lifetime, of resistivity, etc. which in turn result in modifications of some important device parameters such as gain, leakage currents, saturation voltages, etc. with undesired secondary consequences regarding power dissipation, noise generation, etc.

The pipe phenomenon is well known in the semiconductor art. For example, pipes in NPN transistors are defined as cylindrical shaped N-type regions extending from the collector region to reach the emitter region through the P-type base region. It has been shown that crystallographic defects such as stacking faults and dislocations, often act as sites for pipe formation. Enhanced diffusion often takes place along these defects and particularly along dislocation lines. This results in emitter-collector shorts which are detrimental to good device performances. More generally, dislocations which consist of a chain of discontinuities may be considered as a preferential path for charge migration over great distances within the semiconductor material.

Besides shorts and non-uniform doping which are caused by existing dislocations, major problems are raised due to the presence of contaminants in the bulk material. They may be semiconductor impurity atoms or metals, the latter being frequently present in the semiconductor material. They often form metal precipitates or aggregates in or at the vicinity of PN junctions and therefore result in failure sources. The leakage current of these junctions is considerably increased and leads to a poor quality device which must be subsequently rejected. This phenomenon is called softness. It has been shown that precipitation requires nucleation centers; dislocation provides those centers and dopants which precipitate along these dislocations become electrically inactive.

Dislocations, in fact, may be introduced in the bulk material in a variety of ways, particularly thermal processes which currently occur during the wafer processing. Thermal diffusion or non-uniform temperature distributions generate stresses and therefore create dislocations to relieve the stresses. As a matter of fact, diffusion processes generate sufficient stresses within the semiconductor crystal lattice to create dislocation arrays in the diffused region. This may be explained on the following basis: the tetrahedral covalent radii of certain impurity atoms, like boron and phosphorous, are smaller than the one of silicon, and therefore, contraction of the silicon lattice occurs when the diffused atoms occupy substitutional sites. This generation of dislocations has been clearly demonstrated by various authors, for example, S. Prussin, Journal of Applied Physics 32.1876 (1961) and H. J. Queisser, Journal of Applied Physics 321776 (1961). It has been shown also that dislocations are generated early in the diffusion process and are mainly due to the existence of impurity gradients which exist during diffusion.

For a long time, microdefects have been subjected to numerous studies in order to determine manufacturing methods to eliminate them and produce dislocation-free crystals and devices. However, authors like A. H. Cottrel, in a book entitled "Dislocations and Plastic Flow in Crystals", Oxford University Press 1953, have shown that a low dislocation density in the semiconductor bulk material might be beneficial for device production and operation. His statement was based on the gettering effect of dislocations. He demonstrated that dislocations can attract point defects like impurities and surround themselves with an impurity atmosphere. He considered dislocations as internal sinks for point defects like impurities, and concluded that they have the property of cleaning the bulk crystal of existing defects.

Model for soft junctions: excess leakage currents can be induced by migration and/or precipitation of certain impurities typically metal atoms (more specifically, fast diffusing metals: Cu, Au). These metals can be removed by a surface layer of either boron oxide or phosphorous pentoxide deposited upon at least one side of a silicon wafer, preferably the back side. Therefore, one or more gettering steps is usually incorporated in the course of the manufacturing process. This technique has been described by S. W. Ing et al., Journal of the Electrochemical Society, Vol. 110, No. 6, page 553 entitled "Gettering of Metallic Impurities From Planar Silicon Diodes".

On the other hand, it has been also noticed that isolated PN junction transistors are less pipe sensitive than non-isolated transistors. This result was considered as surprising and not well understood. The reason lies in that the heavily doped isolation volume acts in fact as a getter for pipe activating impurities, mainly due to the high dislocation density in the area surrounding the diffused volume. However, recent advances in microelectronics have revealed new techniques, some of them like Fairchild's ISOPLANAR which does not involve PN junction isolation but thermal oxide isolation, and therefore, the gettering opportunities of the diffusion volume will disappear.

In connection with this, those devices which require heavily doped surface layers or regions obviously display some gettering effects, and this is the case for heavily doped ohmic contacts or emitters of diffused transistors.

In addition to the considerations discussed above with respect to the field of the invention, which have lead to the description of the known prior art, it appears to be desirable to present the deficiencies and drawbacks of the prior art solutions.

Generally, even when being heavily doped, these regions are not sufficiently doped to produce a maximum dislocation density and then to display effective gettering properties. It is well known that aluminum which is currently used to produce ohmic contact is a P-type conductivity dopant. When an N-type conductivity silicon substrate is used, the doping amount of underlying silicon must be sufficient to prevent the formation of a PN junction. This explains why the ohmic contacts often involve N+ regions in emitter and collector regions of an NPN transistor and why such a transistor is not provided with a P+ or P++ zone in the base region which would avoid shorts between emitter and collector due to pipe formations. In addition, the locations where dislocations must be introduced appear to be of importance. This will be more detailed hereunder. On the other hand, the gettering by glassy layers involves mainly the deposition of the gettering oxide, at least, on one side of the wafer, generally the back side. This technique is of low interest when there is a heavily doped buried layer which acts as a barrier to the gettering action. Furthermore, gettering oxides deposited on the upper side of the wafer are without any action for gettering deep impurities.

In summary, if the prior art knows the use of heavily doped regions like isolation volumes, emitters or ohmic contacts, their influence with regards to a favorable gettering effect was not really appreciated and therefore the practical link from a pure manufacturing standpoint between the part played by these regions and their effects on device performance and reliability was not clearly established.

SUMMARY OF THE INVENTION

Accordingly, it is a primary object of this invention to provide means to improve semiconductor device quality by gettering all detrimental impurities contained in the bulk material.

It is another object of this invention to provide a gettering process fully compatible with all integrated circuit technology either bipolar or unipolar devices.

It is still another object of this invention to provide a gettering process particularly useful in the PLANAR technique and extensions thereof like the ISOPLANAR technology.

Another object of this invention is a gettering process consisting of introducing stress centers within the semiconductor material and therefor forming dislocations to relieve the stress at desired locations whereby detrimental impurities resulting in pipes or precipitates in the active volume of the device are gettered.

This gettering process basically relies on the gettering properties of crystalline microdefects, typically dislocations. Accordingly, detrimental impurities, typically metal atoms, are then prevented from migrating towards the junction region and removed when already present. Pipes where enhanced diffusions take place and therefore resulting in emitter-collector shorts are also diminished.

The invention suggests to introduce stress centers in the non-active device volume (but in the proximity of the active volume) in order to getter impurities from the active device colume, and/or to introduce stress centers close to the surface of the device contact windows to prevent metallic impurities issued from the interconnection metallurgy from reaching the active device junction.

In a preferred embodiment, it has been noted that the introduction of sufficient quantities of impurities either by diffusion or by ion implantation with atomic radii different from that of the host semiconductor, typically silicon (phosphorous and boron) will result in stresses and ultimately in dislocations to relieve the stresses. To be effective, it must be performed by high concentration diffusions close to or above the solubility limit of said impurities in silicon. The dislocations will attract impurities, and therefore prevent impurities including metal atoms to cause soft junctions, shorts between collector and emitter or other junction modifications by gettering said impurities in the non-active device volume where precipitates or pipes would not influence the electrical properties of the device.

Other ways of introducing said stresses are also depicted in the present application. Mechanical pressure, radiation beams, like laser, have also some dislocation generation capabilities.

BRIEF DESCRIPTION OF THE DRAWINGS

The foregoing and other objects, features and advantages of the invention will be apparent from the following more particular description of the preferred embodiments of the invention as illustrated in the accompanying drawings.

DESCRIPTION OF THE PREFERRED EMBODIMENTS

Figure 1:
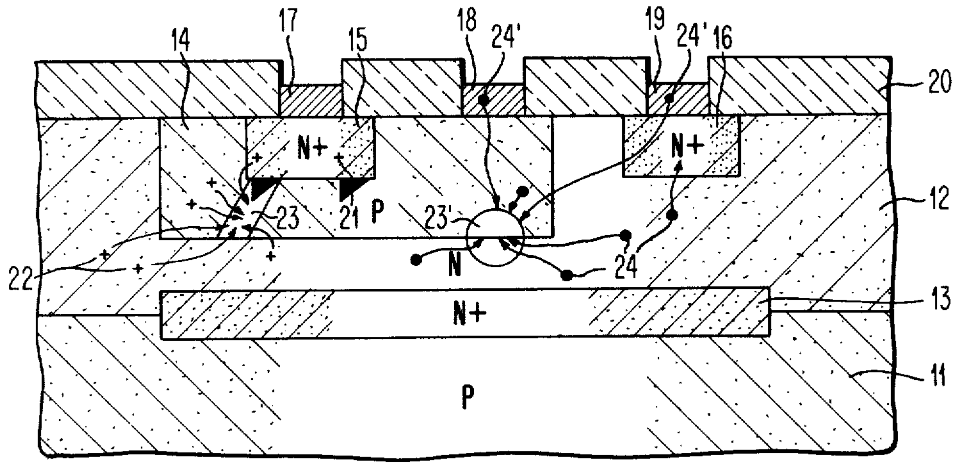
FIG. 1 is a cross-section of an NPN conventional bipolar transistor of a typical use in integrated circuit devices and constructed according to the well known prior art techniques.

The device illustrated in FIG. 1 is a conventional NPN bipolar transistor 10 imaging prior art techniques currently used in present integrated circuit technology. Basically, it comprises a P-type conductivity silicon substrate 11 of relatively high conductivity upon which it has been grown an epitaxial layer 12 composed of N-type single crystal silicon material which will form the collector region. This layer is of relatively high resistivity and of a thickness of about 5 microns. The epi layer and the substrate are separated by a heavily doped N-type conductivity layer 13 which was embodied before the epitaxial growth, and is hereafter referenced as the buried subcollector. The main advantage of the latter is to reduce the collector resistance. However, during the epitaxial growth, the buried subcollector causes the creation of crystal defects typically dislocations in the growing epi layer which tend to propagate within said epi layer. The disadvantages introduced by the subsequent diffusions due to said propagated imperfections will be more specifically explained below. The transistor is achieved by forming the base and emitter regions. A base region 14 of P-type conductivity is formed by diffusing a P-type impurity, like boron, into the N-type epi layer using standard diffusion and photolithography techniques. Similarly, to the formation of the base region 14, an emitter region 15 may be formed by diffusing an appropriate N-type impurity such as arsenic, antimony or phosphorous into the base region. Typically, the thickness of the base region may be about 2.5 microns and thickness of the emitter region may be about 1.5 microns. Simultaneously, an N+ region 16 is formed in the collector region at the location where the ohmic collector contact must take place. To complete the device, a metallized emitter contact 17, a base contact 18 and a collector contact 19 are made, for example, using the vacuum deposition process. Aluminum is currently used for this contacting function. The remaining silicon dioxide layer has been referenced by 20. The crystal defects existing in the bulk silicon material have not been depicted on the drawings. These defects become built into the epitaxial layer as it is grown on the substrate. When N-type impurities are diffused in from the surface of the epitaxial layer to form the emitter diffusion, the concentration is sufficient to induce a certain level of dislocations due to the fact that high enough impurity concentrations are currently used, and therefore increase the number of dislocations being already present. It has been shown by Queisser et al. that foreign atoms, including donors and acceptators, diffuse faster along dislocations than in perfect material. Accordingly, the N-type impurities diffuse faster where there are defects. What occurs is the formation of spikes 21 extending downward from the main emitter base junction in varying distances in the base regions. If these spikes prolongate with gettered donor impurities, represented by crosses 22, along a dislocation line, they extend all the way to the base collector junction, and pipes 23 may occur resulting in shorts which will kill the transistor action. In many cases, these spikes have detrimental effects on certain transistor parameters, such as breakdown voltage.

On the other hand, as it has been detailed above, a number of fast diffusing metals Cu, Au and Al are often present in the semiconductor bulk material. For example, it is well known that gold is most effective as a diffusant to reduce life-time in silicon, but it is also currently used to form an ohmic contact when alloyed with silicon and gold combined with silicon to form an eutectic composition which is widely used for chip bonding techniques. Therefore, gold is widely used in the semiconductor technology. Copper impurities may result, for example, from the polishing process as disclosed in French Patent 1,517,308 and U.S. Pat. No. 3,436,259. In this invention, the silicon surface is polished with a displacement plating solution which contains, among other components, a cupric anion, or from the metallization process as disclosed in French Application No. 70.01477, assigned to the same assignee as the present invention, corresponding to U.S. Pat. No. 3,725,309, where copper doped aluminum thin film stripes are used as current carrying means.

What characterizes these metallic impurities represented by points 24 is their ability to migrate within the semiconductor material, particularly along dislocation lines which are preferential paths for their displacement. Therefore, they tend to fill dislocation sites to form precipitates or pre-precipitates 23' resulting in soft junctions.

Figure 2:
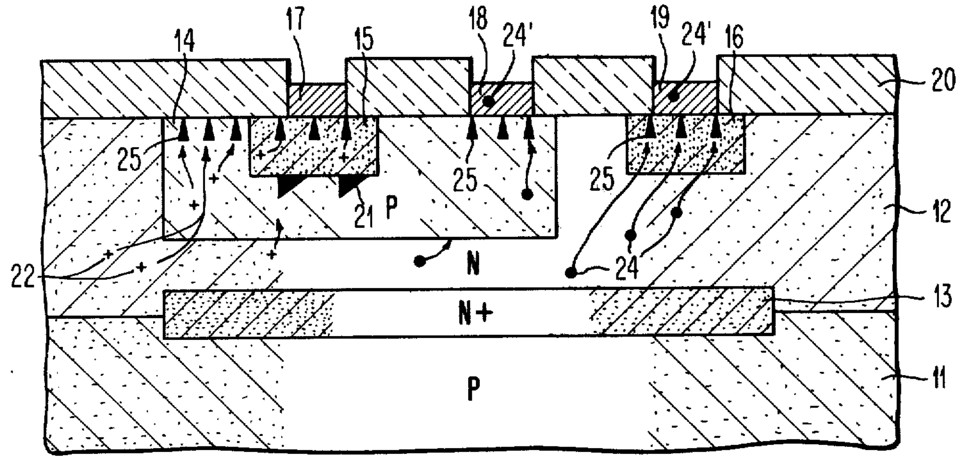
FIG. 2 is a cross-section of an NPN transistor similar to that of FIG. 1 but with the improvements of the present invention, i.e. the gettering means being included.

The same transistor structure has been represented in FIG. 2, according to the teachings of the present invention. In this structure, same objects bearing same references, it will be shown how the introduction of stress centers 25 (presented by triangles) at desired locations will prevent the formation of pipes by gettering impurities, typically donor impurities and, in addition, the formation of precipitates by gettering metallic impurities. The introduction of stress centers close to the upper surface result in the formation of dislocations to relieve the stresses. The gettering properties of dislocations have been demonstrated above according to Cottrell's work. Therefore, the N-type impurities 22 which would have been able to extend the spikes and then create pipes resulting in detrimental shorts are then gettered by these stressed regions as is shown on the left side of the Figure. Similarly, metallic impurities 24 are also cleaned and prevented to form precipitates, as is shown on the right side of the Figure. Of course, if the two gettering actions have been described separately to ease reader's understanding, it must be understood that in fact both semiconductor and metallic impurities are simultaneously gettered by any of the stressed regions. In addition, when stressed regions are formed at an ohmic contact window, they prevent the migration of metallic atoms 24' of the overlying metallurgy, typically Al, Cu, etc., within the semiconductor body.

Figure 3:
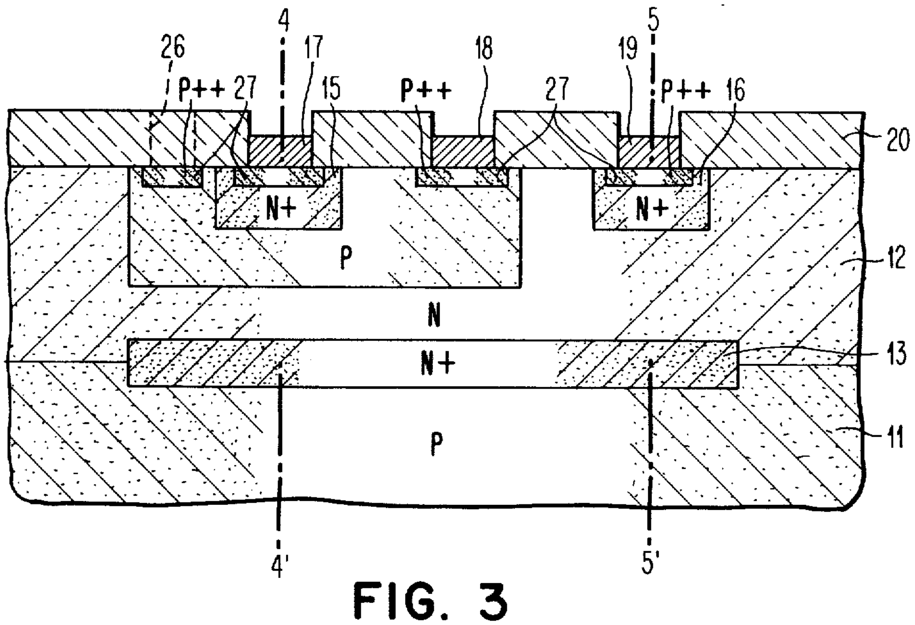
FIG. 3 is a cross-section of an NPN transistor according to a preferred embodiment of the present invention where gettering means are constituted by heavily doped, shallow, diffused zones.

FIG. 3 describes a preferred embodiment to practically produce these stressed regions. In fact, dislocations may be produced into the crystal in a great variety of ways. High temperature diffusions of large concentration of substitutional impurities into shallow surface layers of silicon produce dislocations. The high dislocation density for the case of a shallow diffusion with high concentration must involve both undersized or oversized substitutional impurity atoms. Samples of undersized atoms are boron and phosphorous. They, thus, cause strains in the lattice which are relieved by the formation of dislocations. Dopants with small misfits in silicon, arsenic or gallium should be avoided.

If this condition is fulfilled, the present invention may be implemented with donor impurities (N-type, such as phorphorous), or acceptor impurities (P-type, such as boron), or even with neutral atoms.

In addition to the size of impurity to be introduced, another important factor is the maximum impurity solubility in the silicon at the diffusion temperature. The chosen impurities must have a relatively high maximum solubility. This is the case for boron and phosphorous; therefore the amount of maximum stress introduced by them can easily exceed the elastic limit of silicon.

Figure 4:
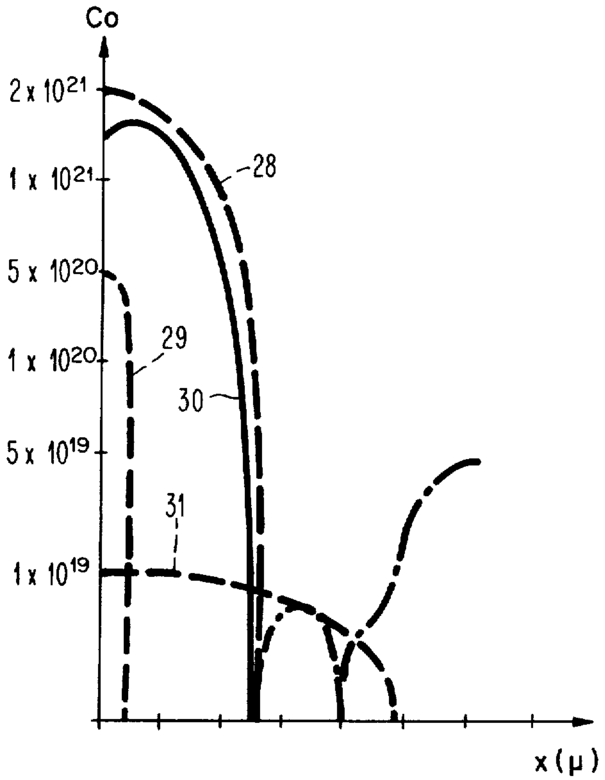
FIG. 4 depicts the impurity concentration profile versus the junction depth under the emitter region window along line 4—4' of FIG. 3.

An impurity gradient with a concentration superior to a critical limit is necessary for the generation of dislocations. According to the literature, this can be achieved by either diffusing these impurities at concentrations well below their solid solubility limits in the host semiconductor material and with a relatively large diffusion depth, or preferably by diffusing these impurities at the limit of solid solubility but with a small diffusion depth. This way has been chosen here. Preferably, the high concentration diffusion is made in the nonactive device volume, i.e. the base region portion which does not operate as junction region for transistor action. Dislocations which also act as recombination centers will not have action on the effective base region. The stressed volume introduced by this diffusion will getter impurities contained in the active device volume. In addition, when said diffusion is made in the ohmic contact window, the stressed volume will prevent metallurgy impurities from reaching the active device volume as it has been understood from FIG. 2. FIG. 3 is representative of such a dual philosophy. The process may be read as follows: after the base and emitter diffusions have been completed and all desired contact windows opened (an additional contact window which can or cannot be used subsequently as a base ohmic contact has been represented in 26), a very short boron diffusion is performed with a concentration at the solubility limit ($5 \times 10^{20}$ at/cm$^3$) to form stressing regions 27. The base surface concentration is normally $10^{19}$ at/cm$^3$ and the emitter and collector contact surface concentrations about $2 \times 10^{21}$ at/cm$^3$. The typical impurity concentration profiles along line 4—4' have been plotted on FIG. 4. The initial emitter concentration profile is referenced by the dotted line 28, the stress center diffusion which is a boron diffusion is represented on dotted line 29, and the final profile resulting of the latter is represented by the full line 30. Only the emitter concentration profile is modified.

Figure 5:
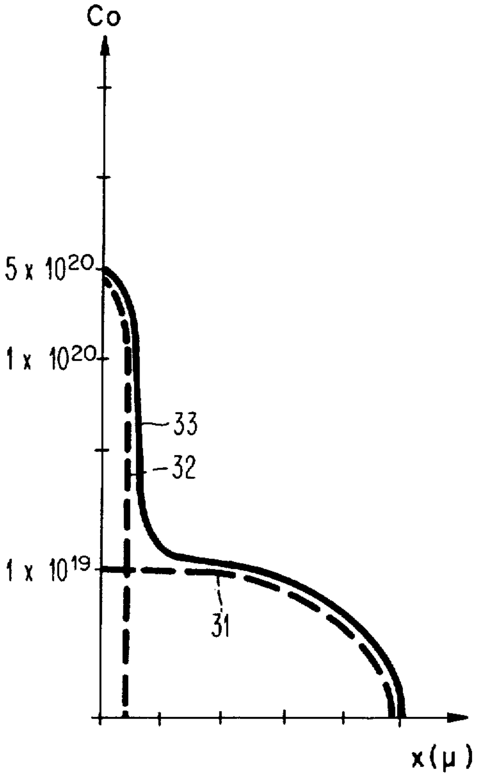
FIG. 5 depicts the impurity concentration profile versus the junction depth under the base region window along line 5—5' of FIG. 3.

The profile along line 4—4' has been represented by a dotted line to the base and collector concentrations for exemplary purposes only. A small diminution of the surface concentration of N-type dopant is normally noticed. The effective emitter concentration will still be $1.5 \times 10^{21}$ at/cm$^3$ N-type and will not effect device performance or metal ohmic contact. The impurity profile under the base contact along line 5—5' is shown in FIG. 5. The initial base concentration profile is represented by dotted line 31 and the stress center diffusion by line 32. The final profile resulting from this additional diffusion is represented by full line 33. It is an additional advantage that the metal to base ohmic contact will be improved because of the higher base contact doping. Other processes may be considered to introduce stress centers, men skilled in the art may think of mechanical means using pressure tips, or more preferably, radiation beams like lasers, or ion implantation techniques.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of gettering impurities, typically metallic atoms, in a monocrystalline silicon device from the active device volume to avoid formation of pipes which result in shorts between two regions of identical conductivity and of a first type of conductivity separated by a region of a second type of conductivity opposite to said first type and/or precipitates or preprecipitates which result in soft junctions, characterized in that it comprises the steps of introducing semiconductor dopants into a monocrystalline silicon body to form the base region, the emitter region, and collector contact region of a transistor, providing a masking layer on the surface of said silicon body, having at least contact openings exposing emitter and collector contact regions of the transistor, introducing substitutional impurity atoms into the exposed regions of the transistor under conditions that produce shallow impurity regions of high impurity concentrations, said substitutional impurity atoms having a solid solubility limit in silicon that is less than the impurity concentration of at least the emitter concentration, said concentrations at or near the solubility limit of the substitutional impurity in the silicon material, said impurity regions forming highly stressed volumes, heating the silicon body to cause gettering of said metallic atoms by said highly stressed volumes.

2. The method of claim 1 wherein said openings in said masking layer are contact openings for the collector, base and emitter contacts.

3. The method of claim 1 wherein said substitutional impurity atoms are undersized atoms selected from the group consisting of born and phosphorous.

4. The method of claim 1 wherein said substitutional atoms are introduced by ion bombardment.

5. The method of claim 1 wherein said substitutional atoms are introduced by diffusion techniques.

6. The method of claim 1 wherein said substitutional impurity atoms are comprised of electrically neutral species.

* * * * *